(12) United States Patent
Ahn et al.

(10) Patent No.: US 11,852,656 B2
(45) Date of Patent: Dec. 26, 2023

(54) PROBE HEAD AND PROBE CARD HAVING SAME

(71) Applicant: POINT ENGINEERING CO., LTD., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: POINT ENGINEERING CO., LTD.

( * ) Notice: Subject to any disclaimer, the term of this patent is extended or adjusted under 35 U.S.C. 154(b) by 0 days.

(21) Appl. No.: 17/214,785

(22) Filed: Mar. 26, 2021

(65) Prior Publication Data
US 2021/0302472 A1 Sep. 30, 2021

(30) Foreign Application Priority Data
Mar. 31, 2020 (KR) .......... 10-2020-0038878

(51) Int. Cl.
*G01R 1/073* (2006.01)
(52) U.S. Cl.
CPC .............. *G01R 1/07342* (2013.01)
(58) Field of Classification Search
CPC ........... G01R 1/07342; G01R 1/07378; G01R 1/07314; G01R 1/07357; G01R 1/18; G01R 1/07371; G01R 31/2863; G01R 31/2886; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07321; G01R 1/07328; G01R 1/07335; G01R 1/0735; G01R 1/07364; G01R 1/07385; G01R 1/07392
See application file for complete search history.

(56) References Cited

U.S. PATENT DOCUMENTS

| | | | | |
|---|---|---|---|---|
| 2007/0269999 | A1* | 11/2007 | Di Stefano | G01R 1/06738 439/73 |
| 2009/0166079 | A1* | 7/2009 | Hatanaka | H05K 3/426 205/183 |
| 2021/0005992 | A1* | 1/2021 | Zhou | H01R 13/15 |

FOREIGN PATENT DOCUMENTS

| | | | | |
|---|---|---|---|---|
| EP | 0180013 | * | 7/1986 | |
| KR | 20040003735 | A | 1/2004 | |
| WO | WO-2006136139 | A1 * | 12/2006 | G01R 1/07371 |
| WO | WO-2018108777 | A1 * | 6/2018 | G01R 1/06772 |

OTHER PUBLICATIONS

English Machine Translation of Schaefer WO 2006/136139 (Year: 2006).*

* cited by examiner

*Primary Examiner* — Lee E Rodak
(74) *Attorney, Agent, or Firm* — Renaissance IP Law Group LLP

(57) ABSTRACT

Proposed is a probe head having a probe card for performing a circuit inspection of a wafer. More particularly, proposed are a probe head and a probe card having the probe head, the probe head having a guide plate. The guide plate has a guide hole and a shield portion composed of a metal material positioned at the periphery of the guide hole, thereby blocking signal interference that may be occurred between adjacent probes.

7 Claims, 15 Drawing Sheets

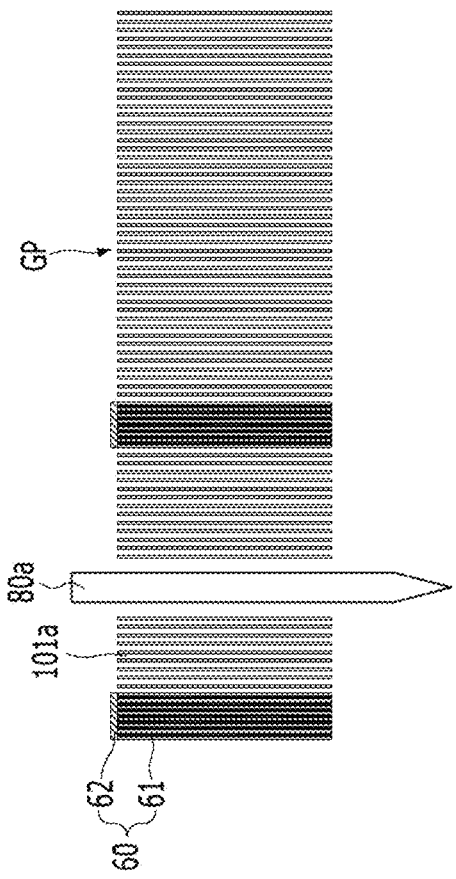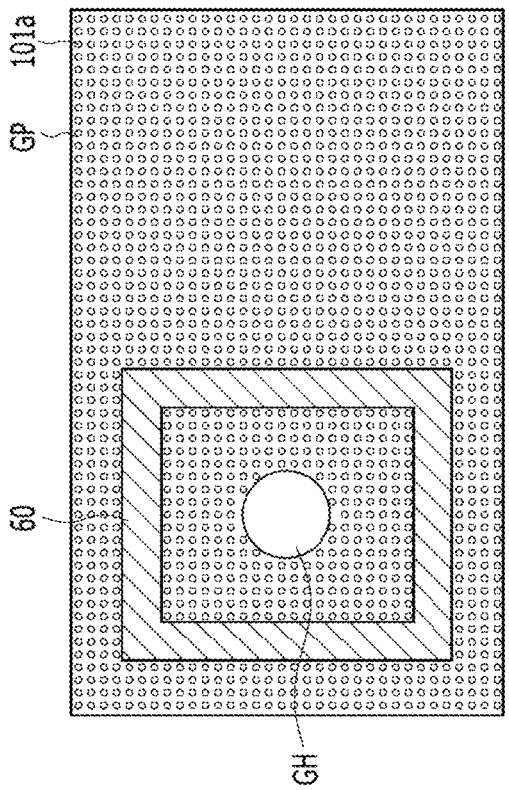

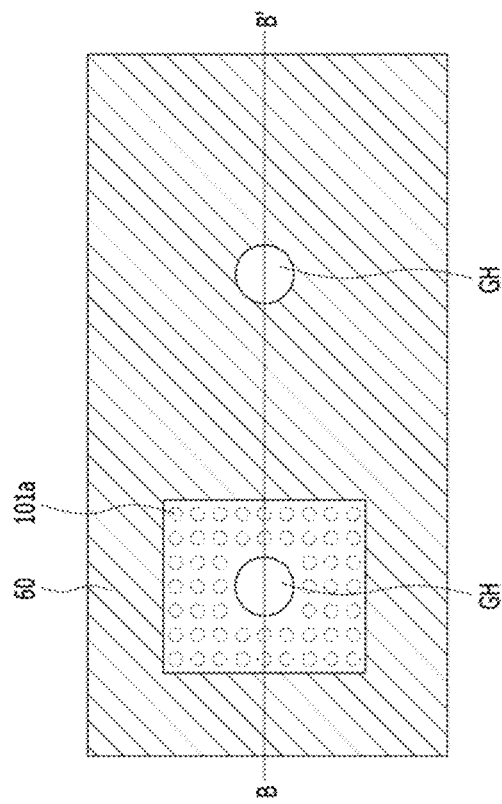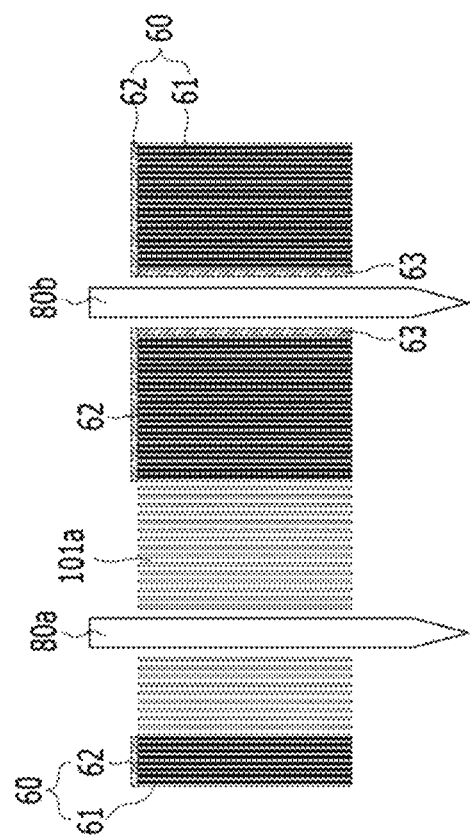

PROBE HEAD AND PROBE CARD HAVING SAME

CROSS REFERENCE TO RELATED APPLICATION

The present application claims priority to Korean Patent Application No. 10-2020-0038878, filed Mar. 31, 2020, the entire contents of which is incorporated herein for all purposes by this reference.

BACKGROUND

1. Field

The present disclosure relates to a probe head provided in a probe card for inspecting a pattern formed on a wafer, and to the prove card having the same.

2. Description of the Related Art

The semiconductor inspection process may be divided into a front end inspection process that is an Electrical Die Sorting (EDS) process inspecting electrical characteristics of a chip manufactured at a wafer level, and a back end inspection process inspecting an integrated circuit (IC) of the semiconductor manufactured at a package level.

The front end inspection process is performed to sort out defective chips among the chips configuring the wafer, and a probe card, which is a semiconductor inspecting device, is used to determine defects on the basis of signals checked from applied electrical signals by applying electrical signals to chips configuring the wafer.

The probe card has a structure in which a plurality of inspection pins (probe needles) are formed at positions corresponding to terminals of the wafer.

Such a probe card is disclosed in Korean Patent Application Publication No. 10-2004-0003735 (hereinafter, referred to as "Patent Document 1").

In Patent Document 1, an electrical signal is transmitted to a Device Under Test (DUT) through a probe in contact with the DUT, and a defective DUT is sorted out depending on the returned electrical signal.

However, in Patent Document 1, an electromagnetic wave is generated at a periphery of the probe when the electrical signal is transmitted through the probe, and the generated electromagnetic wave induces signal interference to the signal transmitted through a signal probe, so that measurement reliability of DUT measured by the signal probe may be decreased.

In addition, the visibility of conventional guide plates is not secured, so that it takes a lot of time to insert the probes into the guide holes manually. Moreover, positional displacement may occur in a high-temperature environment due to a large difference in the coefficient of thermal expansion between the wafer and the inspecting side.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been keeping in mind the above problems occurring in the related art, and the present disclosure is intended to propose a probe head that is capable of blocking signal interference between probes by forming a shield portion at a periphery of a guide hole into which the probe is inserted.

In addition, the present disclosure is intended to propose a probe head that is capable of securing visibility and minimizing positional displacement in a high-temperature environment.

A probe head according to an aspect of the present disclosure includes a guide plate on which a guide hole is provided, and the guide plate includes a shield portion positioned at a periphery of the guide hole.

In addition, the guide plate may be formed of an anodic oxide film material.

In addition, the shield portion may be formed by filling pores of an anodic oxide film.

In addition, the shield portion may be formed by forming an etching hole at the guide plate and then filling the etching hole with a metal material.

In addition, the shield portion may include a vertical formation portion formed in a longitudinal direction of the guide hole.

In addition, the shield portion may include a horizontal formation portion formed in a transverse direction of the guide hole.

In addition, the shield portion may be grounded.

In addition, the shield portion may be electrically connected to a ground probe inserted in the guide hole.

In addition, the guide plate may be formed by stacking a plurality of unit anodic oxide film sheets.

A probe card according to an aspect of the present disclosure includes: a space transformer including a vertical wiring portion, a horizontal wiring portion connected to the vertical wiring portion, and a plurality of connection pads; a circuit board provided at an upper side of the space transformer; and a probe head provided at a lower side of the space transformer and including a plurality of probes, wherein the probe head includes a guide plate on which a guide hole is provided, and wherein the guide plate includes a shield portion formed at a periphery of the guide hole.

According to the present disclosure, signal interference between adjacent probes may be blocked by forming the guide plate with the anodic oxide film material and forming the shield portion at the periphery of the guide hole into which the signal probe is inserted.

In addition, by forming the guide plate with the anodic oxide film material, the visibility of the guide plate is secured, so that positional misalignment between an inspecting side and a wafer may be minimized in a high-temperature environment.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 4A is an enlarged view illustrating a portion A of FIG. 3;

FIG. 4B is a view illustrating a cross-section of FIG. 4A;

FIG. 8A is an enlarged view illustrating a portion B of FIG. 7;

FIG. 8B is a cross-sectional view taken along line B-B' of FIG. 8A;

DESCRIPTION OF THE PREFERRED EMBODIMENTS

Figure 1:
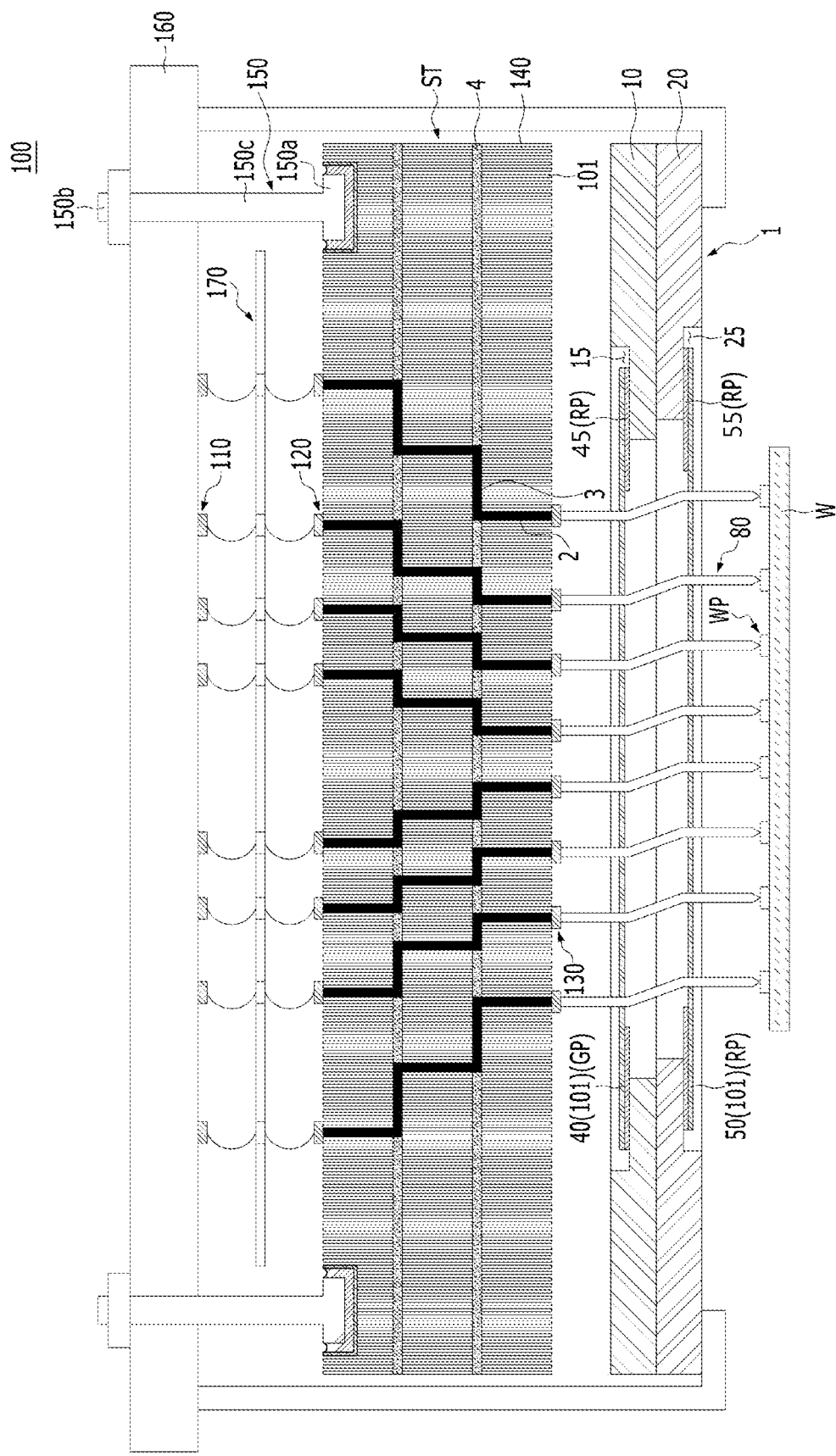
FIG. 1 is a view schematically illustrating a probe card in which a probe head according to an exemplary embodiment of the present disclosure is installed.

The following description merely exemplifies the principle of the present disclosure. Thus, although not explicitly described or shown in this disclosure, various devices in which the principle of the present disclosure is implemented and which are encompassed in the concept or scope of the present disclosure can be invented by one of ordinary skill in the art. It should be appreciated that all the conditional terms enumerated herein and embodiments are clearly intended only for a better understanding of the concept of the present disclosure, and the present disclosure is not limited to the particularly described embodiments and statuses.

The forgoing objectives, advantages, and features of the present disclosure will become more readily apparent from the following detailed description taken in conjunction with the accompanying drawings, and accordingly, one of ordinary skill in the art may easily practice the embodiment of the present disclosure.

Embodiments are described herein with reference to sectional and/or perspective illustrations that are schematic illustrations of idealized embodiments. Also, for convenience of understanding of the elements, in the figures, thicknesses of members and regions and diameters of holes may be exaggerated to be large for clarity of illustration. As such, variations from the shapes of the illustrations as a result, for example, of manufacturing techniques and/or tolerances, are to be expected.

In addition, the number of holes shown in the drawings is by way of example only. Thus, embodiments should not be construed as limited to the particular shapes illustrated herein but are to include deviations in shapes that result, for example, from manufacturing.

Wherever possible, the same reference numerals will be used throughout different embodiments and the description to refer to the same or like elements or parts having like functions throughout. Furthermore, the configuration and operation already described in other embodiments will be omitted for convenience of the description.

Hereinafter, a probe head 1 according to an exemplary embodiment of the present disclosure will be described with reference to FIGS. 1 to 12C.

FIG. 1 is a view schematically illustrating a probe card 100 having the probe head 1 according to the exemplary embodiment of the present disclosure. In this case, for convenience of description, the number and size of a plurality of probes 80 are illustrated exaggerated.

The probe card 100 may be classified into a vertical type probe card, a cantilever type probe card, and a MEMS (Micro Electro Mechanical System) type probe card. The types of the probe card 100 are defined according to a structure in which the probe 80 is installed in a space transformer ST and a structure of the probe 80. In the present disclosure, the vertical type probe card 100 is illustrated as an example, and a structure in which the space transformer ST and other components are coupled is illustrated. The types of the probe card having this structure in which the space transformer ST and other components are coupled is not limited thereto, and this structure may be implemented on the MEMS type probe card and the cantilever type probe card.

FIG. 1 is a view illustrating a state in which the probes 80 are in contact with electrode pads WP of a wafer W. An electrical characteristics test of semiconductor devices is performed in such a way as to bring a semiconductor wafer W close to the probe card 100 of which a number of probes 80 are formed on a wiring board, and thereby bring the respective probes 80 into contact with corresponding electrode pads WP on the semiconductor wafer W. After the probes 80 have reached a position at which the probes 80 are in contact with the electrode pads WP, the wafer W may be further moved upward to a predetermined height toward the probe card 100. Such a process may be referred to as overdrive.

As illustrated in FIG. 1, the probe card 100 of the present disclosure is formed of an anodic oxide film 101 material, and may include the space transformer ST including a vertical wiring portion 2, a horizontal wiring portion 3 connected to the vertical wiring portion 2, and probe connection pads 130 that are electrically connected to the plurality of probes 80, and a coupling member 150 having one end thereof 150A fixed to a surface of the space transformer ST and the other end 150B thereof coupled to a circuit board 160 provided at an upper side of the space transformer ST.

As illustrated in FIG. 1, the circuit board 160 may be provided at the upper side of the space transformer ST, and the probe head 1 having the plurality of probes 80 may be provided at the lower side of the space transformer ST. In other words, the space transformer ST may be positioned between the circuit board 160 and the probe head 1. The space transformer ST may be coupled to the nearby components by the coupling member 150.

The coupling member 150 has a structure in which one end 150A thereof is fixed to the surface of the space transformer ST and the other end 150B thereof is coupled to the circuit board 160, so that the space transformer ST may be coupled to the circuit board 160 via the coupling member 150. According to the present disclosure, with such a structure, the space transformer ST may be solidly coupled to the circuit board 160 without having an additional member that is configured to support the space transformer ST.

The space transformer ST connected to the circuit board 160 having this structure by the coupling member 150 may be electrically connected to the circuit board 160 by having an interposer 170 between the circuit board 160 and the space transformer ST. Specifically, a first interposer connection pad 110 may be provided at the upper surface of the space transformer ST, and a second interposer connection pad 120 may be provided at the lower surface of the circuit board 160. Therefore, the interposer 170 positioned between the space transformer ST and the circuit board 160 is bonded to the first interposer connection pad 110 and the second interposer connection pad 120, so that the interposer 170 may be perform the electrical connection between the space transformer ST and the circuit board 160.

The space transformer ST may be formed of the anodic oxide film 101 material. The anodic oxide film 101 refers to a film formed by anodizing a base metal, and pores 101A refer to holes that are formed during forming the anodic oxide film 101 by anodizing the base metal. For example, if the base metal is aluminum (Al) or an aluminum alloy, when the base material that is the base metal is anodized, the anodic oxide film 101 formed of anodized aluminum ($Al_2O_3$) is formed on the surface SF of the base metal. The anodic oxide film 101 thus formed includes a barrier layer BL in which the pores 101A are not formed inside, and a porous layer PL in which the pores 101A are formed inside. The barrier layer BL is positioned at an upper portion of the base material, and the porous layer PL is positioned at the upper portion of the barrier layer BL. Accordingly, when the base material is removed from the base material in which the anodic oxide film 101 having the barrier layer BL and the porous layer PL is formed on the surface of the base material, only the anodic oxide film 101 formed of anodized aluminum ($Al_2O_3$) material remains. The anodic oxide film 101 has the pores 101A having a uniform diameter and formed in a vertical shape with a regular arrangement. In this case, if the barrier layer BL is removed, a structure in which the pores 101A are vertically penetrated is formed.

The anodic oxide film 101 has a coefficient of thermal expansion of 2 to 3 ppm/° C. Therefore, there is less thermal deformation. In addition, the coefficient of thermal expansion of the anodic oxide film 101 is close to the coefficient of thermal expansion of the wafer W, thus minimizing misalignment in a high-temperature environment.

In the present disclosure, by configuring the space transformer ST with the anodic oxide film 101 material, the space transformer ST with less thermal deformation in the high-temperature environment may be realized.

The probe head 1 is provided under the space transformer ST. The probe head 1 may include a first plate 10, a second plate 20, a guide plate GP including an upper guide plate 40 and a lower guide plate 50, the plurality of probes 80, and a reinforcing plate RP including an upper reinforcing plate 45 and a lower reinforcing plate 55. For example, the probe head 1 may be coupled by bolting. However, since the bolting is an example means of coupling, a bolt used in the bolting is omitted in FIGS. 1, 2A, and 2B.

The probe head 1 may be formed in a structure in which the second plate 20 is provided under the first plate 10.

Hereinafter, the configuration of the probe head 1 will be described with reference to FIGS. 1, 2A, and 2B.

Figure 2A:
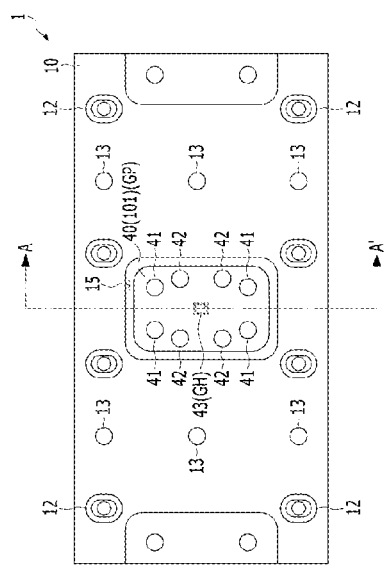
FIGS. 2A and 2B are views schematically illustrating the probe head according to the exemplary embodiment of the present disclosure.
Figure 2B:
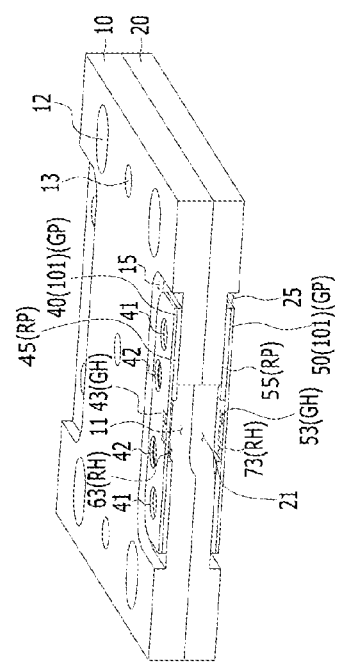

FIG. 2A is a view schematically illustrating the probe head 1 according to an exemplary embodiment of the present disclosure when viewed from above, and FIG. 2B is a perspective view illustrating a cross-sectional area taken along line A-A' of FIG. 2A.

As illustrated in FIGS. 2A and 2B, upper coupling holes 12 and upper guide pin insertion holes 13 may be formed on the first plate 10. The upper guide pin insertion holes 13 are configured to align the second plate 20 easily.

Since the second plate 20 is provided under the first plate 10, a coupling means so as to couple the first plate 10 and the second plate 20 may be provided at the upper coupling holes 12. As an example, the coupling means may be a bolt.

Guide pins configured to easily align the first plate 10 and the second plate 20 before bolting the first plate 10 and the second plate 12 through the upper coupling holes 12 may be positioned at the upper guide pin insertion holes 13.

Lower coupling holes and lower guide pin insertion holes may be formed on the second plate 20. The bolt positioned at the upper coupling holes 12 may be positioned at the lower coupling holes, and the guide pins inserted into the upper guide pin insertion holes 13 may be positioned at the lower guide pin insertion holes. The guide pins may be removed before bolting the upper coupling holes 12 and the lower coupling holes together.

The second plate 20 may be formed so as to have the corresponding shape of the first plate 10. Therefore, on the second plate 20, the coupling holes and the guide pin insertion holes may be formed at the corresponding positions at which the upper coupling holes 12 and the upper guide pin insertion holes 13 are positioned, respectively.

In this case, the positions, the shapes, and the numbers of the upper coupling holes 12 of the first plate 10 and the upper guide pin insertion holes 13 of the first plate 10 in FIGS. 2A and 2B are illustrated as an example, so that the positions, the shapes, and the numbers of the upper coupling holes 12 and the upper guide pin insertion holes 13 are not limited thereto.

When the guide plate GP and the reinforcing plate RP are molded or bonded to an upper and a lower seating areas 15 and 25 of the first and the second plates 10 and 20, respectively, the guide plate GP and the reinforcing plate RP at the first plate 10, and the guide plate GP and the reinforcing plate RP at the second plate 20 may be bolted to each other after shifting positions thereof. This is may be to elastically deform the plurality of probes 80 vertically inserted in a shape of a straight line through an upper and a lower guide holes 43 and 53.

The structure in which the probes 80 are elastically deformed by shifting positions of the first and the second plates 10 and 20 after the guide plate GP and the reinforcing plate RP are provided at the first and the second plates 10 and 20 may be implemented as the structure that is illustrated in FIG. 1.

As illustrated in FIGS. 2A and 2B, the area of the upper guide plate 40 may be smaller than the area of the first plate 10. Accordingly, the remaining surface of the first plate 10 except for an upper surface having the upper guide plate 40 may be exposed.

Figure 12A:
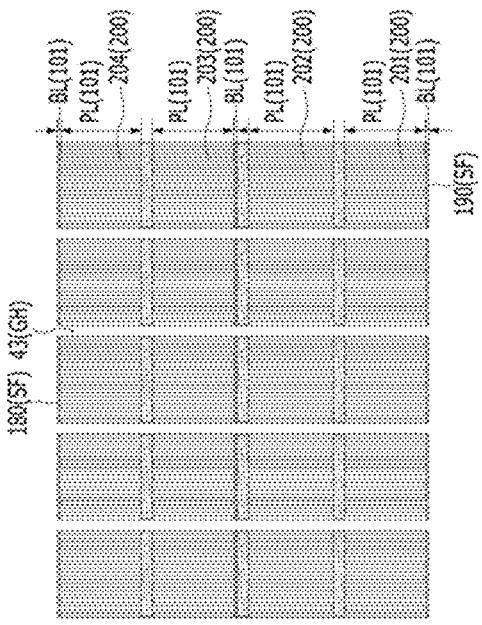

The upper and the lower guide plates 40 and 50 may be formed to have shapes that are corresponding each other, and may be configured to have the same configuration (for example, the guide holes GH into which the plurality of probes 80 are inserted are provided in the upper and the lower guide plates 40 and 50). Therefore, if the probe card 100 is illustrated when viewed from the side, the probe card 100 may be implemented as illustrated in FIG. 12A.

Accordingly, in the probe head 1, the areas of the upper and the lower guide plates 40 and 50 are smaller than the areas of the first and the second plates 10 and 20, so that the remaining surfaces except for the upper and the lower surfaces 180 and 190 at which the upper and the lower guide plates 40 and 50 are provided at the surfaces of the first and the second plates 10 and 20 may be exposed.

Due to this structure, the probe head 1 of the present disclosure may be easily handled. Specifically, when the one end of the probe 80 firstly inserted into the guide hole into which the plurality of probes 80 are inserted is the tip of the probe 80, the upper and the lower guide plates 40 and 50 may guide the tips of the plurality of the probes 80. Therefore, the upper and the lower guide plates 40 and 50 may be configured to form a probing area of the probe card 100. The first and the second plates 10 and 20 supporting the upper and the lower guide plates 40 and 50 may form the entire area of the probe head 1. Therefore, the area in which the upper and the lower guide plates 40 and 50 are provided among the entire area of the probe head 1 may be the probing area.

The areas of the upper and the lower guide plates 40 and 50 of the probe head 1 of the present disclosure are smaller than the areas of the first and the second plates 10 and 20, so that the problem of the probing area being directly damaged or impaired may be minimized. Therefore, the probing area may be easily managed.

Unlike the probe head 1 of the present disclosure, if the upper and the lower guide plates 40 and 50 are formed at the entire area of the probe head 1, an unnecessary area in addition to the probing area that is performing the actual probing process by having the plurality of probes 80 is included, and the unnecessary area increases the entire area of the probe head 1.

This structure may cause a problem in that even if a portion of the probe head 1 is damaged, the probing area is damaged, so that it is difficult to manage the probing area. However, in the probe head 1 of the present disclosure, the areas of the upper and the lower guide plates 40 and 50 forming the probing area are smaller than the areas of the first and the second plates 10 and 20, so that the risk of being damaged may be reduced and the probe head 1 may be easily managed.

In addition, in the probe head 1 of the present disclosure, the areas of the upper and the lower guide plates 40 and 50 are smaller than the areas of the first and the second plates 10 and 20 that form the entire area of the probe head 1, so that surface flatness of the upper and the lower guide plates 40 and 50 are more relatively uniform than the structure in which the areas of the upper and the lower guide plates 40 and 50 form the entire of the probe head 1.

If the upper and the lower guide plates 40 and 50 form the entire area of the probe head 1, it is difficult to form a uniform surface flatness because of the large area. If the surface flatness of the upper and the lower guide plates 40 and 50 at which the guide holes into which the probes 80 are inserted are formed is not uniform, an error may occur when inspecting the pattern of the wafer due to a change in the position of the probes 80. However, in the probe head 1 of the present disclosure, the areas of the upper and the lower guide plates 40 and 50 into which the probes 80 are inserted are smaller than the area of the probe head 1, so that it may be advantageous to uniformly form the surface flatness.

The upper guide plate 40 configured to guide the end portion of the probe 80 may be supported by the top surface of the first plate 10 that is forming the probe head 1. The first plate 10 has an area larger than the upper guide plate 40, so that the first plate 10 may support the upper guide plate 40 from at least a portion of the area of the top surface of the first plate 10.

On the first plate 10, the upper seating area 15 configured to accommodate the upper guide plate 40 may be included. In this case, the upper seating area 15 is positioned on the top surface of the first plate 10, and is not limited to any one of the areas of the top surface of the first plate 10.

As an example, as illustrated in FIG. 1, the upper guide plate 40 may be provided at the center of the first plate 10 with respect to a centerline vertically positioned in the surface of the first plate 10.

The upper guide plate 40 may be positioned at the upper seating area 15 provided at the top surface of the first plate 10. In this case, the upper seating area 15 may be formed to have a shape of recessed groove on the top surface of the first plate 10. However, the upper seating area 15 having the recessed groove shape is illustrated as an example, so that the shape of the upper seating area 15 is not limited thereto. Therefore, the upper seating area 15 on the top surface of the first plate 10 may have a shape that is suitable to stably positioning the upper guide plate 40.

The upper guide plate 40 may be easily guided to a position at which the upper guide plate 40 is to be placed by the upper seating area 15 formed on the top surface of the first plate 10.

The first plate 10 may have a first through hole 11. The first through hole 11 may be provided to position the plurality of probes 80 that are inserted through the upper guide hole 43 of the upper guide plate 40. Therefore, the first through hole 11 may be positioned at the corresponding position at which the upper guide hole 43 of the upper guide plate 40 is positioned, and the plurality of the probes 80 are positioned at the first through hole 11. In consideration of the elastic deformation of the plurality of probes 80, the first through hole 11 may be configured to have an internal diameter being capable of accommodating the plurality of probes 80.

As illustrated in FIGS. 1 to 2B, the second plate 20 may be coupled to the bottom of the first plate 10.

The lower guide plate 50 configured to guide the end portion of the probe 80 may be supported by the bottom surface of the second plate 10. In this case, the second plate 20 may be formed so as to have the corresponding area of the first plate 10. Therefore, the second plate 20 may support the lower guide plate 50 from at least a portion of the area of the bottom surface of the second plate 20.

The bottom surface of the second plate 20 may have a lower seating area 25 configured to accommodate the lower guide plate 50. In this case, the lower seating area 25 is not limited to any one of the areas of the bottom surface of the second plate 20.

The second plate 20 may be formed in the same shape as the first plate 10, so that the second plate 20 may be coupled to the bottom surface of the first plate 10 in an inverted form. Accordingly, the lower seating area 25 of the second plate 20 may have the same shape as the upper seating area 15, and may be positioned at an inverted position.

The lower guide plate 50 may be positioned at the lower seating area 25 provided at the bottom surface of the second plate 20. In this case, the lower seating area 25 may be formed to have a shape of recessed groove at the bottom surface of the second plate 20. However, the shape of the lower seating area 25 is illustrated as an example, so that the shape of the lower seating area 25 is not limited thereto.

The lower guide plate 50 may be easily guided to the position at which the lower guide plate 50 is to be placed by having the lower seating area 25 at the bottom surface of the second plate 20.

As illustrated in FIG. 2B, the first plate 10 and the second plate 20 may have inverted shapes with respect to the contact interface of the first and the second plates 10 and 20. Accordingly, the upper seating area 15 of the first plate 10 configured to position the upper guide plate 40, and the lower seating area 25 of the second plate 20 configured to position the lower guide plate 50 may be positioned in positions that are inverted with respect to each other.

In addition, the upper and lower guide plates 40 and 50 that are positioned at the upper and the lower seating areas 15 and 25, respectively, may be positioned in positions that are inverted with respect to each other. However, the inverted shapes of the first and the second plates 10 and 20 are illustrated as an example, and the shapes of the first and the second plates 10 and 20 are not limited thereto.

In the second plate 20, a second through hole 21 corresponding to the first through hole 11 may be formed. This allows the probes 80 positioned in the first through hole 11 to be positioned in the second through hole 21 also. An internal diameter of the second through hole 21 may be formed to have the same internal diameter as the first through hole 11. However, the size of the internal diameter is not limited thereto, and the internal diameter of the second through hole 21 may be formed to have smaller size than the internal diameter of the first through hole 11. However, the size of the internal diameter of the second through hole 21 may have a size that is capable of accommodating the plurality of probes 80 even if the plurality of probes 80 are elastically deformed.

Alternatively, the second through hole 21 may be formed at a position corresponding to the first through hole 11, and the size of the internal diameter of the second through hole 21 may be larger than the size of the internal diameter of the first through hole 11.

The plurality of probes 80 may be positioned inside the first and the second through holes 11 and 21, which is due to the plurality of probes 80 inserted into the upper guide hole 43 of the upper guide plate 40 and inserted into the lower guide hole 53 of the lower guide plate 50. Therefore, the probe head 1 may be formed of the first through hole 11 provided at the first plate 10 and the second through hole 21 provided at the second plate 20, so that the probe head 1 may have a shape in which the plurality of probes 80 are positioned inside the first and the second through holes 11 and 21.

At least one surface of each of the upper and the lower guide plates 40 and 50 may have the reinforcing plate RP. In the present disclosure, as illustrated in FIGS. 1 and 2B, the reinforcing plates RP are positioned at the bottom surface of the upper guide plate 40 and the top surface of the lower guide plate 50, respectively, as an example. Therefore, the mechanical strength of the upper and lower guide plates 40 and 50 may be increased.

If the reinforcing plates RP are positioned at at least one surface of each of the upper and the lower guide plates 40 and 50, the reinforcing plates RP may be configured as an upper reinforcing plate RP that is coupled to one surface of the upper guide plate 40 and a lower reinforcing plate RP that is coupled to one surface of the lower guide plate 50.

Therefore, the guide pin insertion hole 41 configured to align positions of the upper guide plate 40 and the upper reinforcing plate 45 that is provided at one surface of the upper guide plate 40 may be formed at the upper guide plate 40. In addition, a main bolt fastening hole 42 into which the bolt for bolting the upper reinforcing plate 45 to the first plate 10 is inserted may be formed on the upper guide plate 40.

The lower guide plate 50 is formed to have the corresponding shape of the upper guide plate 40, so that a guide pin insertion hole and a main bolt fastening hole that are performing the same function and having the same shape at the same position may be formed at the lower guide plate 50.

The reinforcing plate RP may have a reinforcing hole RH that is a cut groove at which the plurality of probes 80 are positioned. In this case, a reinforcing hole 102 formed at the upper reinforcing plate RP may be an upper reinforcing hole 63, and a reinforcing hole 102 formed at the lower reinforcing plate RP may be a lower reinforcing hole 73.

For example, the reinforcing hole RH may be formed in a shape having a square cross-section, but the shape of the reinforcing hole RH is not limited thereto. Accordingly, a cross-section of the reinforcing hole RH may be a circular shape.

The area of the reinforcing hole RH of the reinforcing plate RP may be formed to have a larger size than the areas of existing areas of the upper and the lower guide holes that are formed by forming the plurality of the upper and the lower guide holes at the upper and the lower guide plates 40 and 50 so as to position the plurality of probes 80.

The reinforcing plates RP having reinforcing holes RH are provided at one surface of the upper and the lower guide plates 40 and 50, so that a structure in which one surface and the other surface of the upper and the lower guide plates 40 and 50 are supported by the reinforcing plates RP may be formed.

The reinforcing plates RP may be configured to support the upper and the lower guide plates 40 and 50, so that it may preferably be formed of a material with high mechanical strength. Specifically, the reinforcing plate RP may be formed of $Si_3N_4$ material. In addition, the reinforcing plate RP may be formed of ceramic material. In this case, the reinforcing hole RH may be formed in a way that is suitable for each material composition.

The reinforcing plates RP and the upper and the lower guide plates 40 may be bonded, or the upper and the lower guide plates 40 and 50 and the upper and the lower reinforcing plates 45 and 55 may be stacked, or the upper portion of the lower reinforcing plate 55 may be molded or bonded.

With this structure, the miniaturized and narrowed pitch of the upper and the lower guide holes 43 and 53 may be implemented at the upper and the lower guide plates 40 and 50 formed of the anodic oxide film 101 material, and may also have an advantage as an aspect of mechanical strength.

The probe head 1 may have a structure in which the upper reinforcing plate RP and the upper guide plate 40 that is provided at the upper seating area 15 are stacked in an opposite direction of the stacked direction of the lower reinforcing plate RP and the lower guide plate 50 provided at the lower seating area 25. Accordingly, the mechanical strength of the upper and the lower guide plates 40 and 50 that are configured to guide sliding of the probes 80 may be increased.

The material of the anodic oxide film 101 having a thin thickness may be more effective in forming the upper and the lower guide holes 43 and 53 vertically. In addition, the material of the anodic oxide film 101 may be a suitable material for miniaturizing and narrowing of pitches of the upper and the lower guide holes 43 and 53. At least one of the upper and the lower guide plates 40 and 50 are formed of the anodic oxide film 101 material, and the structure in which the upper and the lower reinforcing plates 45 and 55 are coupled to one surface of each of the upper and the lower guide plates 40 and 50 is formed to the probe head 1, so that the miniaturizing and narrowing of pitches of the upper and the lower guide holes 43 and 53 may be realized. At the same time, bending deformation is prevented and it is possible to have excellent durability.

The guide plate GP positioned on the probe head 1 may be formed of the anodic oxide film 101 material. The guide plate GP formed of the anodic oxide film 101 material may have the plurality of pores 101A that are arranged regularly on an upper surface of the guide plate GP and the lower surface of the guide plate GP.

The guide hole GH and a shield portion 60 may be formed at the guide plate GP.

The guide hole GH may be formed by etching the guide plate GP, and may be formed perpendicular to the guide plate GP. The plurality of guide holes GH may be formed on the guide plate GP. The probe 80 may be inserted into the guide hole GH.

Figure 3:
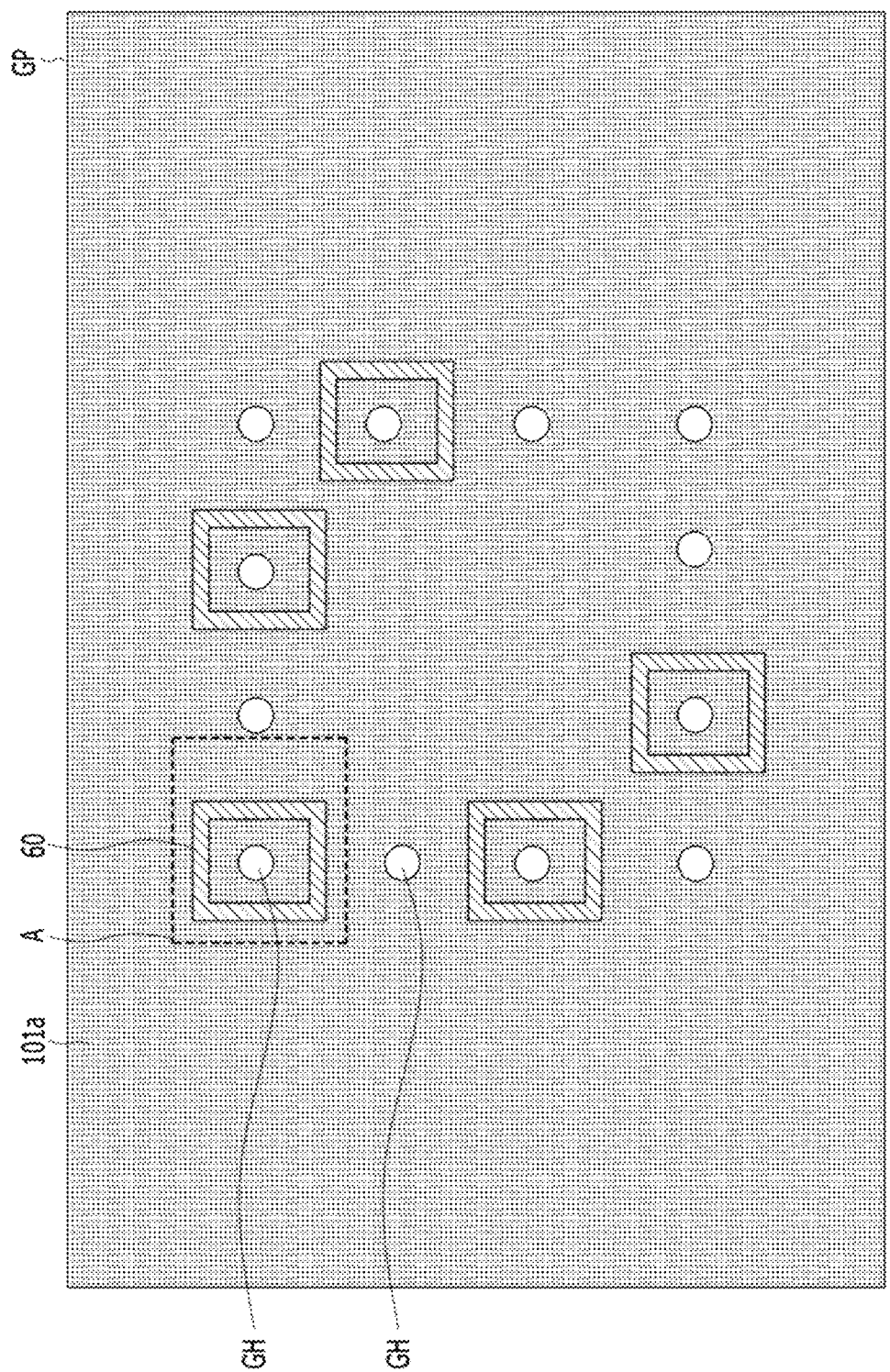
FIG. 3 is a top view illustrating a guide plate provided at the probe head according to the exemplary embodiment of the present disclosure.

As illustrated in FIGS. 3 and 4A, the shield portion 60 may be formed at a periphery of the guide hole GH, and may be formed of a vertical formation portion 61 and a horizontal formation portion 62. As illustrated in FIG. 3, the shield portion 60 may be provided at at least one of the plurality of guide holes GH. Among the plurality of guide holes GH, the shield portion 60 may be provided at the periphery of the guide hole GH in which a signal probe 80A is provided. The shield portion 60 may be provided in a polygonal shape or such as a rectangular shape or a circular shape at the periphery of the guide hole GH. In the present disclosure, the shield portion 60 having a rectangular shape is described as an example.

As illustrated in FIG. 4B, the vertical formation portion 61 may be formed in a longitudinal direction that is the same direction as the formation direction of the guide hole GH. The vertical formation portion 61 may be formed in the vertical direction of the guide plate GP by filling a metal material in the pores 101A. The vertical formation portion 61 may be configured to prevent an electrical signal of the probe 80 inserted into the guide hole GH from interfering with an adjacent probe 80.

The horizontal formation portion 62 may be formed in a transverse direction that is perpendicular to the direction of formation of the guide hole GH. The horizontal formation portion 62 may be formed on at least one of the top and the bottom surfaces of the guide plate GP, and may be formed in contact with the vertical formation portion 61. The horizontal formation portion 62 may be formed such that the bottom surface of which is in contact with the top surface of the vertical formation portion 61. It is preferable that the horizontal formation portion 62 is formed of a metal material.

Figure 5A:
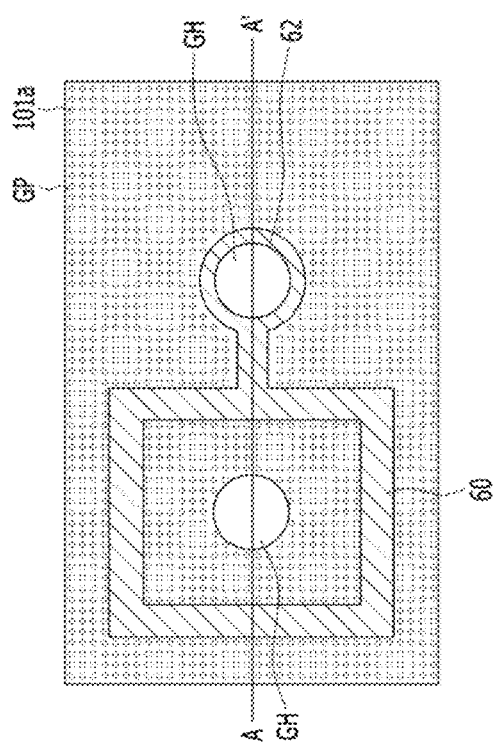
FIG. 5A is a view illustrating a portion of a top surface of the guide plate of the present disclosure.

As illustrated in FIG. 5A, the horizontal formation portion 62 may be extended to an adjacent guide hole GH. In other words, the horizontal formation portion 62 may be extended to another guide hole GH except for the guide hole GH positioned inside the shield portion 60. The horizontal formation portion 62, which is extended, may be formed by being connected to an inner wall extension portion 63 that is formed in the adjacent guide hole GH.

Figure 6B:
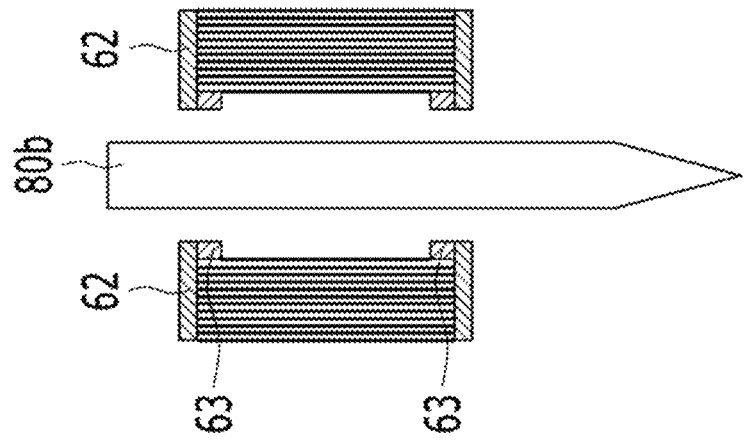
FIGS. 6A and 6B are views illustrating cross-sectional shapes of a horizontal formation portion.
Figure 6A:
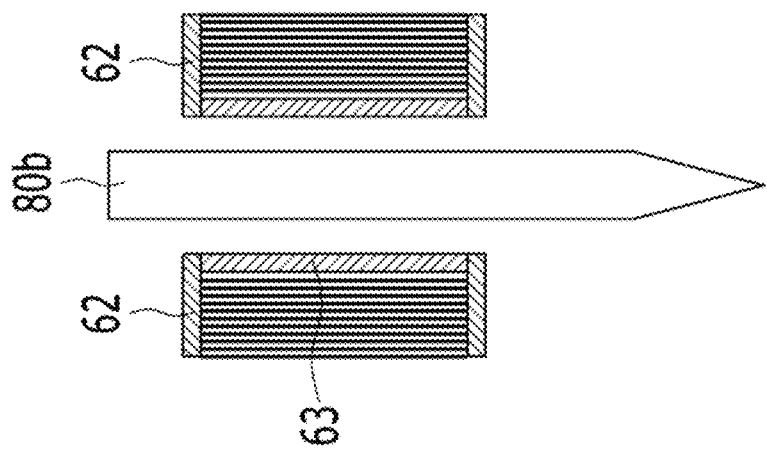

Specifically, as illustrated in FIG. 6A, the horizontal formation portion 62 may be formed by extending from the upper surface of the guide plate GP to the adjacent guide hole GH. Herein, the inner wall extension portion 63 may be formed at an inner wall of the guide hole GH. The inner wall extension portion 63 may be formed in the overall area from the upper portion to the lower portion of the inside of the guide hole GH. The inner wall extension portion 63 may be electrically connected by being in contact with the horizontal portion 62.

Alternatively, as illustrated in FIG. 6B, the inner wall extension portion 63 may be formed only a portion of the inner surface of the guide hole GH. The inner wall extension portion 63 may be partially formed at the upper portion and the lower portion of the inner wall of the guide hole GH.

This is because the inserted probe 80 may be in contact with the inner wall extension portion 63, even if the inner wall extension portion 63 is partially formed only on the upper portion and the lower portion of the guide hole GH.

The horizontal formation portion 62 may be configured to integrally connect the vertical formation portions 61 formed by filling the plurality of pores 101A, and may be configured to connect the vertical portions 61 integrally connected to the horizontal portion 62 with other guide hole GH or a ground.

The probes 80 may be inserted into each of the guide holes GH. It is preferred that the probe 80 inserted into the guide hole GH formed at the inside of the shield portion 60 is a signal probe, and it is preferred that the probe 80 inserted into the guide hole GH formed at the outside of the shield portion 60 is a ground probe.

The shield portion 60 is provided at the periphery of the guide hole GH, so that signal interference that may occur between the signal probe 80A inserted in the guide hole GH that is positioned inside the shield portion 60 and an adjacent signal probe 80A may be prevented.

If the shield portion 60 is provided at the periphery of the guide hole GH, the shield portion 60 may be grounded.

Figure 5B:
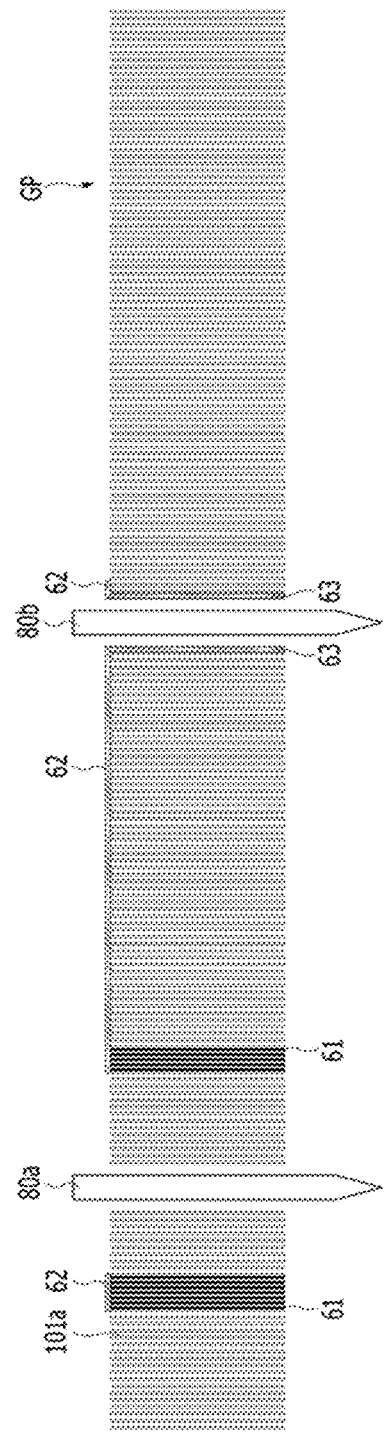
FIG. 5B is a cross-sectional view taken along line A-A' of FIG. 5A.

As illustrated in FIGS. 5A and 5B, if the shield portion 60 is provided at the guide plate GP, the shield portion 60 may be grounded by being connected to the ground surface. Herein, the shield portion 60 may be grounded by connecting the horizontal formation portion 62 to a separate ground.

In addition, as illustrated in FIG. 5A, the shield portion 60 may be grounded by electrically connecting the ground probe 80B to the shield portion 60.

Specifically, as illustrated in FIG. 5B, the horizontal formation portion 62 may extend from the upper surface of the guide plate GP to the guide hole GH that is provided at the outside of the shield portion 60. Herein, the horizontal formation portion 62 may be connected to the inner wall extension portion 63 formed at the inner wall of the guide hole GH.

The ground probe may be inserted into the guide hole GH where the horizontal formation portion 62 is extended. Therefore, the shield portion 60 may be grounded by electrically connecting the vertical formation portion 61 to the ground probe 80B via the horizontal formation portion 62.

Figure 7:
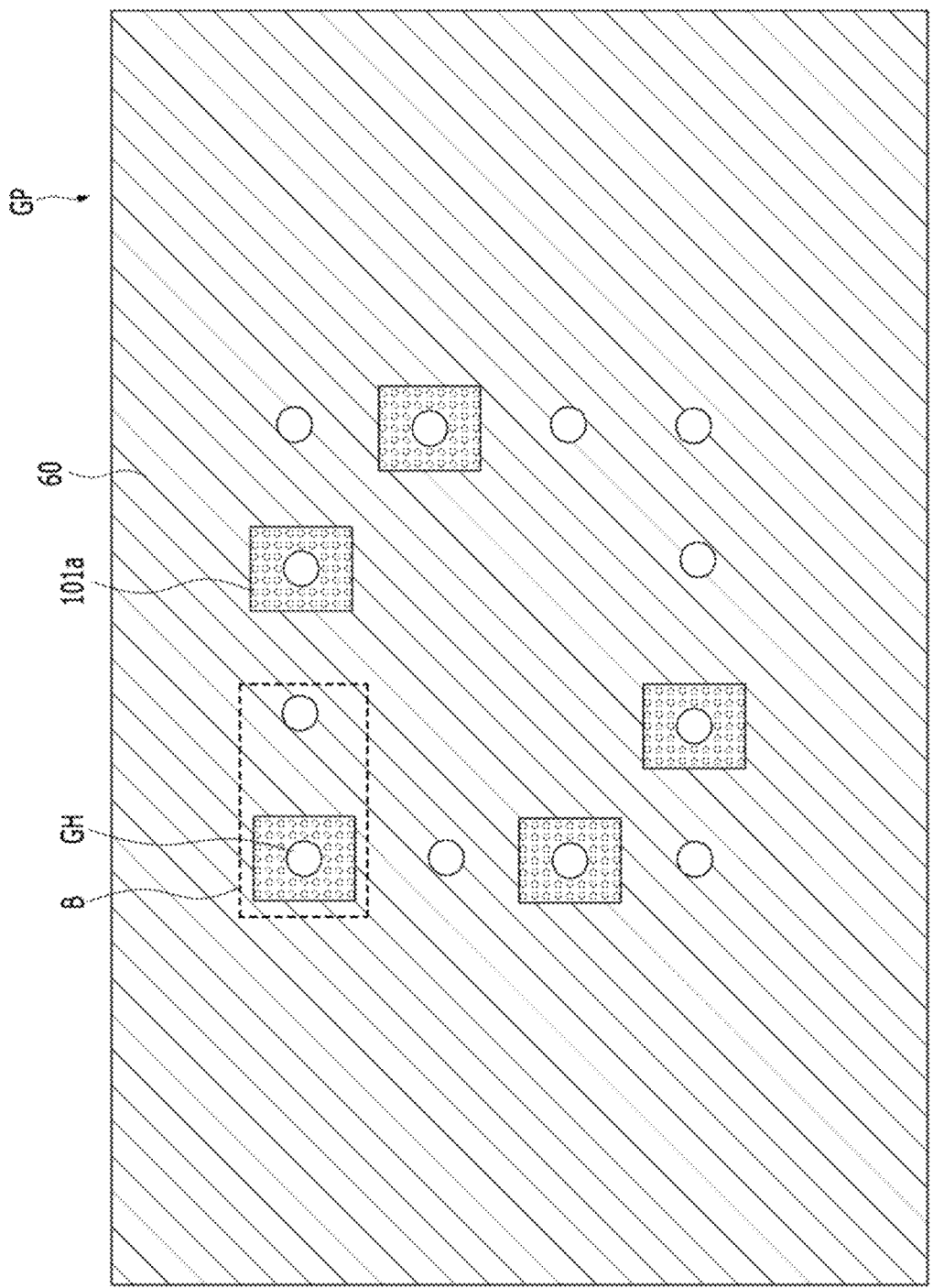
FIG. 7 is a view illustrating a variant of the present disclosure in which a shield portion is formed on the guide plate.

The shield portion 60 may be formed at at least one of the upper guide plate 40 or the lower guide plate 50.

alternatively, as illustrated in FIG. 7, the shield portion 60 may be formed at the entire area of the guide plate GP, excluding the periphery of the guide hole GH at which the signal probe 80A is positioned. In other words, a portion of the upper surface of the guide plate GP where between the shield portion 60 and the guide hole GH at which the signal probe 80A is provided may be exposed.

As illustrated in FIGS. 8A and 8B, the horizontal formation portion 62 may be formed at which the vertical formation portion 61 is formed on the upper surface of the guide plate GP. As illustrated in FIG. 8B, the horizontal formation portion 62 may be connected to the inner wall extension portion 63 formed at the inner wall of the guide hole GH into which the ground probe 80B is inserted.

Alternatively, the shield portion 60 may be formed by forming a separate etching hole H at the guide plate GP and then filling an inside of the etching hole H with a metal material.

The shield portion 60 may be formed by forming etching holes H at the periphery of the guide hole GH into which the signal probe 80A is inserted and then filling the inside of the etching holes H with the metal material.

Figure 9A:
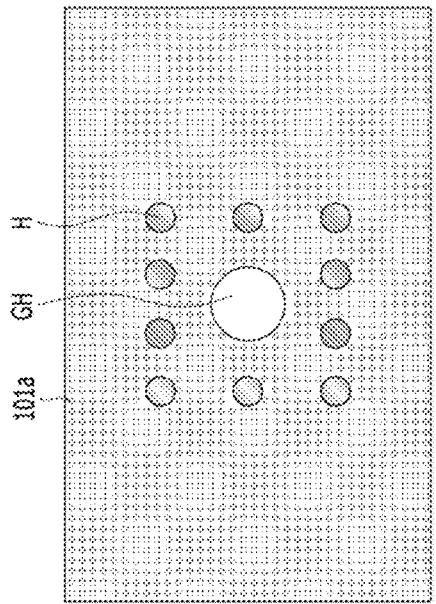
FIGS. 9A and 9B are views illustrating a variant of the present disclosure in which the shield portions are formed by forming separate holes.

As illustrated in FIG. 9A, a plurality of etching holes H having a predetermined distance around the guide hole GH may be formed. Herein, the plurality of etching holes H may be formed in a shape surrounding the periphery of the guide hole GH. When the plurality of etching holes H are formed, the shield portion 60 may be formed by filling the inside of the plurality of etching holes H with the metal material.

Figure 9B:
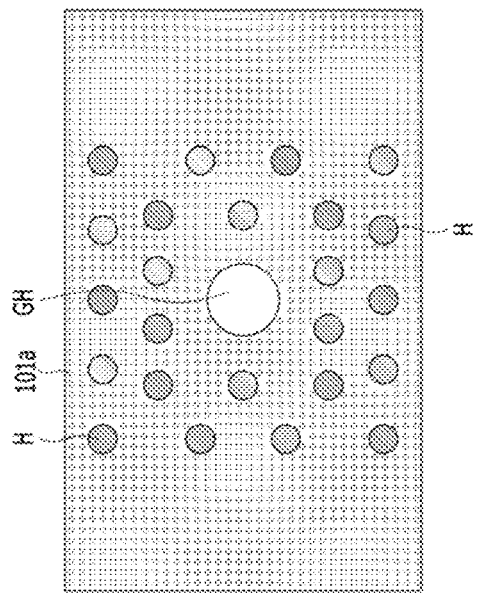

The plurality of etching holes H may be formed in a plurality of layers along the outside of the guide hole GH. As illustrated in FIG. 9B, the etching holes H are formed in the plurality of layers at the periphery of the guide hole GH, and the etching holes H forming an outer layer may be positioned in a diagonal direction of the etching holes H forming an inner layer. As such, the plurality of etching holes H are formed in the plurality of layers, but the holes H of the outer layer and the inner layer have a zigzag shape, so that the signal interference between the probes 80 may be more efficiently blocked.

The guide plate GP may be formed by stacking a plurality of unit anodic oxide film sheets 200.

Hereinafter, the structure of the upper guide plate 40 or the lower guide plate 50 configured in a structure in which the plurality of unit anodic oxide film sheets 200 are stacked will be described in detail with referring to FIGS. 10A to 11C. The plurality of unit anodic oxide film sheets 200 may be bonded by a suitable method of bonding the unit anodic oxide film sheet 200. As an example, the unit anodic oxide film sheets 200 may be bonded to each other by a sheet bonding layer 300 that is bonding the unit anodic oxide film sheet 200.

Figure 10B:
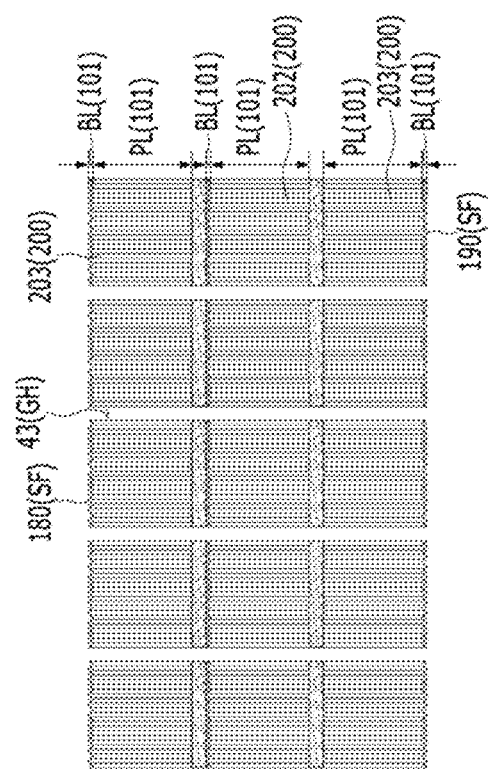
FIGS. 10A to 12C are enlarged views illustrating a plurality of unit anodic oxide film sheets having a stacked structure forming the guide plate.
Figure 10A:
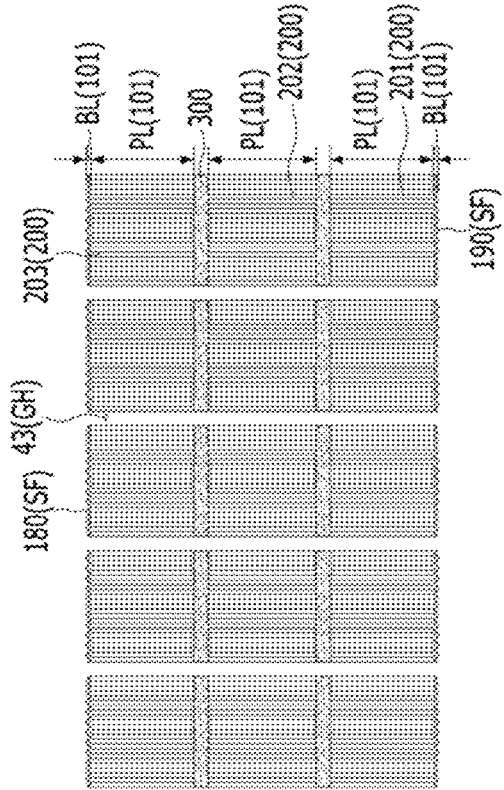
Figure 10C:
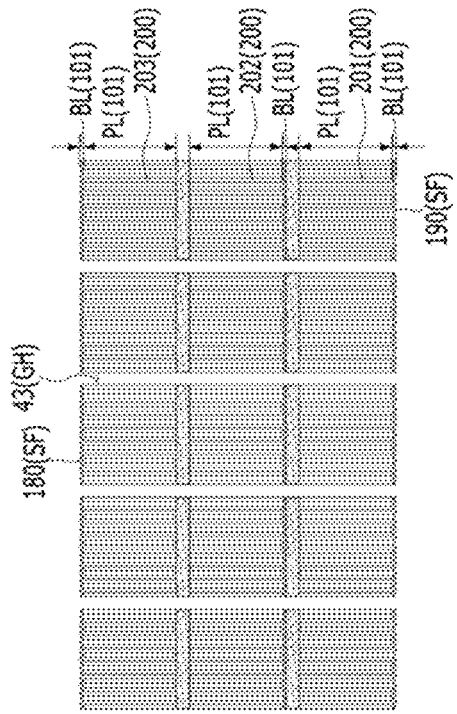
Figure 11A:
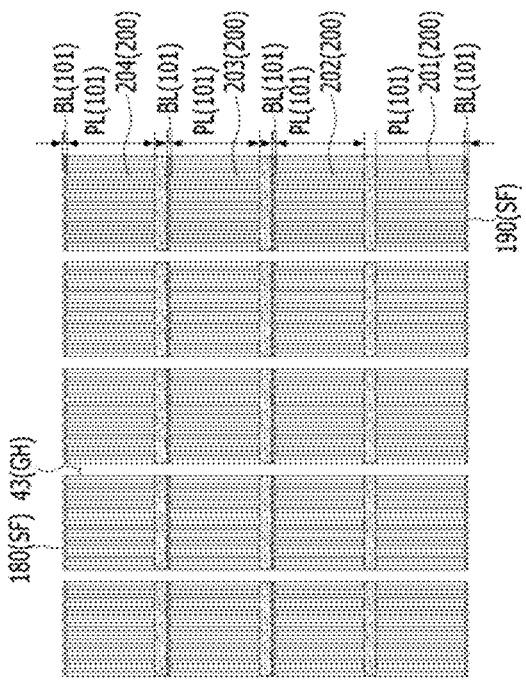
Figure 11B:
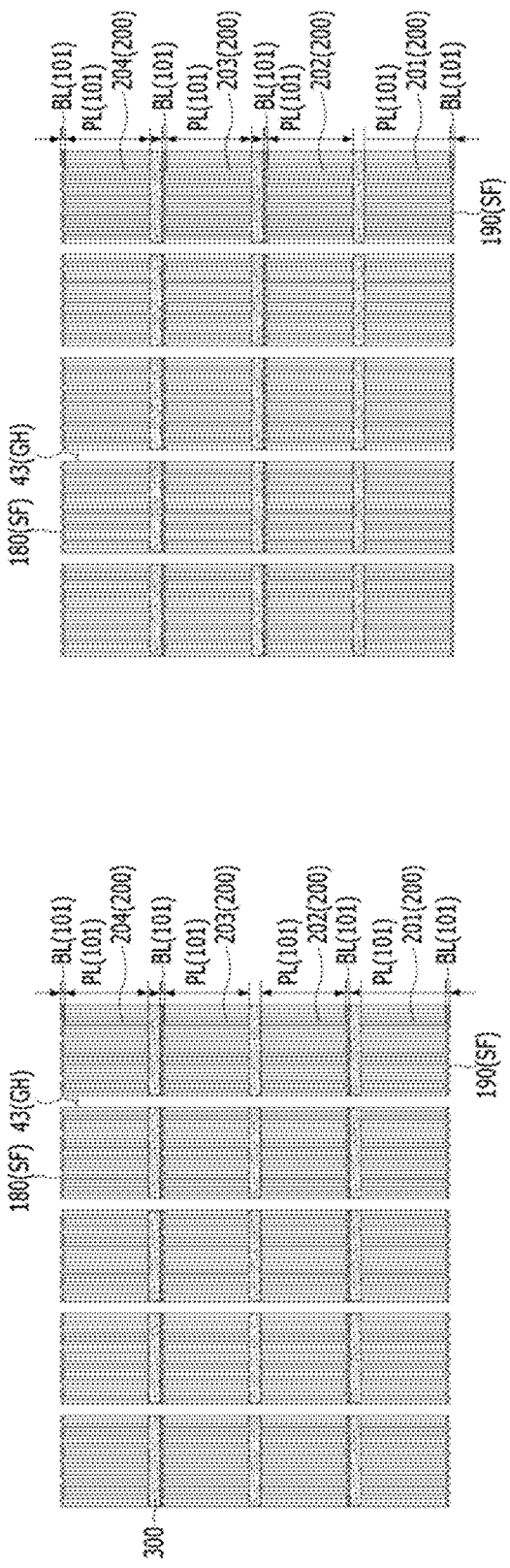
Figure 11C:
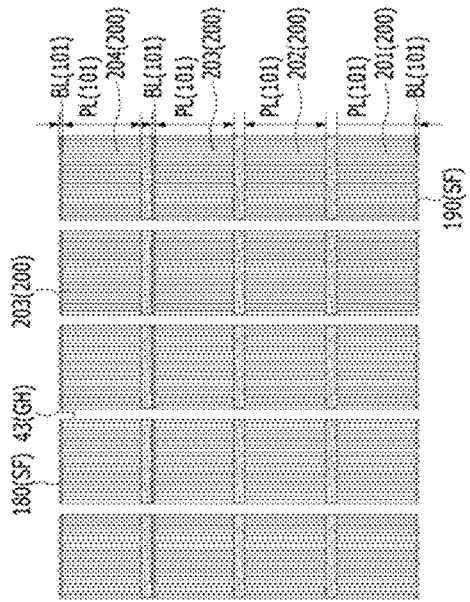

FIGS. 10A to 11C may illustrate at least one of the upper guide plate 40 or the lower guide plate 50, which is described as an example. Hereinafter, it will be described as the upper guide plate 40 as an example. In FIGS. 10A and 11C, for convenience of description, a portion of the upper guide plate 40 having upper guide holes 43 is magnified and schematically illustrated.

First, FIGS. 10A to 10C illustrate various embodiments of stacked structures when the upper guide plate 40 is formed of an odd number of unit anodic oxide film sheets 200. As an example, a first to a third unit anodic oxide film sheets 201, 202, and 203 may be sequentially stacked.

As illustrated in FIG. 10A, the upper guide plate 40 may be provided with the first unit anodic oxide film sheet 201 forming the lower surface 190. The first unit anodic oxide film sheet 201 may be formed of the porous layer PL at which the pores 101A are included, and the anodic oxide film 101 having the barrier layer BL at the lower portion of the porous layer PL. In addition, a third unit anodic oxide film sheet 203 forming the upper surface 180 of the upper guide plate 40 may be formed of the anodic oxide film 101 having the barrier layer BL at the upper portion of the porous layer PL. Then, the second unit anodic oxide film sheet 202 formed of the anodic oxide film 101 formed of the porous layer PL from which the barrier layer BL is removed may be interposed between the first unit anodic oxide film sheet 201 and the third unit anodic oxide film sheet 203.

As illustrated in FIG. 10A, the upper guide plate 40 is formed such that the first unit anodic oxide film sheet 201 is provided such that the barrier layer BL is positioned at the lower surface of the porous layer PL, then the second unit anodic oxide film sheet 202 is stacked on the top surface of the first unit anodic oxide film sheet 201, and then the third unit anodic oxide film sheet 203 is provided such that the porous layer is positioned at the upper surface of the barrier layer BL and positioned at the top surface of the second unit anodic film sheet 202.

The upper guide plate 40 may be formed of a structure in which the upper surface 180 and the lower surface 190 are formed of the barrier layers BL by the first unit anodic oxide film sheet 201 and the third unit anodic oxide film sheet 203. As illustrated in FIG. 10A, the upper guide plate 40 may have a symmetrical structure in which the surfaces SF including the upper surface 180 and the lower surface 190 are all formed of the barrier layer BL.

In contrast to that illustrated in FIG. 10A, the upper guide plate 40 formed of the plurality of unit anodic oxide film sheets 200 may be formed in various structures by changing only the structure of the second unit anodic oxide film sheet 202 except for the first unit anodic oxide film sheet 201 and the third unit anodic oxide film sheet 203 that form the surfaces SF of the upper guide plate 40.

The upper guide plate 40 illustrated in FIG. 10B differs in that the structure of the second unit anodic oxide film sheet 202 illustrated in FIG. 10A is different.

As illustrated in FIG. 10B, the second unit anodic oxide film sheet 202 may form the upper guide plate 40 by being provided in a structure in which the barrier layer BL is positioned at the upper portion of the porous layer PL.

Alternatively, as illustrated in FIG. 10C, the second unit anodic oxide film sheet 202 may form the upper guide plate 40 by being provided in a structure in which the barrier layer BL is positioned at the lower portion of the porous layer PL.

Accordingly, the upper guide plate 40 may be variously implemented by having the structures of the first and the third unit anodic oxide film sheets 201 and 203 forming the surfaces SF including the upper and the lower surfaces 180 and 190 to be provided in which the barrier layers BL are symmetrical to each other, and by varying the structure of the second unit anodic oxide film sheet 202 that is provided between the first and the third unit anodic oxide film sheets 201 and 203.

As illustrated in FIGS. 10A to 10C, the upper guide plate 40 may be formed to have a structure in which the barrier layers BL are symmetrical to the surfaces SF, so that the densities of the upper and the lower surfaces of the upper guide plate 40 may be uniform. This structure may prevent bending deformation.

In addition, since the surface SF of the upper guide plate 40 except for the upper guide hole 43 is covered by the barrier layer BL, the problem of particles entering the upper guide plate 40 may be prevented.

In addition, when the probe 80 is inserted through the upper guide hole 43, since the opening portion of the inner wall of the upper guide hole 43 is formed of a dense barrier layer BL, so that the abrasion resistance may be relatively high. This structure may minimize the problem of particles during inserting the probe 80.

FIGS. 11A to 11C is a view illustrating a stacked structures when the upper guide plate 40 is formed of even number of unit anodic oxide film sheets 200. As an example, the first to fourth unit anodic oxide film sheets 201, 202, 203, and 204 may be sequentially stacked.

The upper guide plate 40, regardless of the number of the plurality of the unit anodic oxide film sheets 200, may be provided to form a structure in which the upper and the lower surfaces 180 and 190 having the barrier layers BL are symmetrical to each other by forming the surfaces SF including the upper and the lower surfaces are formed of the barrier layers BL.

Specifically, as illustrated in FIG. 11A, the first unit anodic oxide film sheet 201 forming the lower surface 190 of the upper guide plate 40 may be provided in a structure in which the barrier layer BL is positioned at the lower portion of the porous layer PL. In addition, the fourth unit anodic oxide film sheet 204 forming the upper surface 180 of the upper guide plate 40 may be provided in a structure in which the barrier layer BL is positioned at the upper portion of the porous layer PL. Accordingly, the upper and the lower surfaces 180 and 190 of the upper guide plate 40 is formed of the barrier layer BL, so that a structure in which the barrier layers BL are symmetrical to each other is formed.

The second and the third unit anodic oxide film sheets 202 and 203 provided between the first and the fourth unit anodic oxide film sheets 201 and 204 forming the upper and the lower surfaces 180 and 190 of the upper guide plate 40 may be provided in a various forms.

As illustrated in FIG. 11A, the second unit anodic oxide film sheet 202 stacked on the top surface of the first unit anodic oxide film sheet 201 may be formed in a structure in which the barrier layer BL is positioned at the lower surface of the porous layer PL. The third unit anodic oxide film sheet 203 stacked on the top surface of the second unit anodic oxide film 202 may be formed in a structure in which the barrier layer BL is positioned at the upper surface of the porous layer PL.

Alternatively, as illustrated in FIG. 11B, the second unit anodic oxide film sheet 202 is formed in a structure in which the barrier layer BL exists on the upper surface of the porous layer PL, and may be stacked on the top surface of the first unit anodic oxide film sheet 201.

Alternatively, as illustrated in FIG. 11C, the second unit anodic oxide film sheet 202 may be formed of the anodic oxide film 101 from which the barrier layer BL is removed, and may be stacked on the first unit anodic oxide film sheet 201.

Alternatively, as illustrated in FIG. 12A, the second unit anodic oxide film sheet 202 having the barrier layer BL at the lower surface thereof may be stacked on the top surface of the first unit anodic oxide film sheet 201, and the third unit anodic oxide film sheet 203 having the barrier layer BL at the lower surface thereof may be stacked on the top surface of the second unit anodic oxide film sheet 202.

Figure 12B:
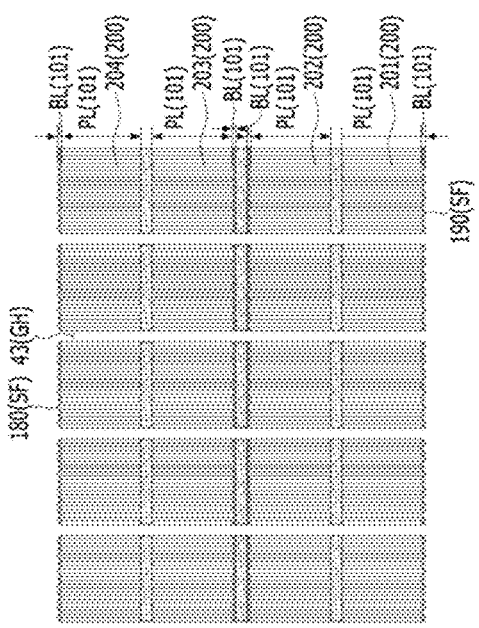

Alternatively, as illustrated in FIG. 12B, the second unit anodic oxide film sheet 202 formed of the porous layer PL by removing the barrier layer BL thereof may be stacked on the top surface of the first unit anodic oxide film sheet 201, and the third unit anodic oxide film sheet 203 having the barrier layer BL at the bottom surface thereof may be stacked on the top surface of the second unit anodic oxide film sheet 202.

Figure 12C:
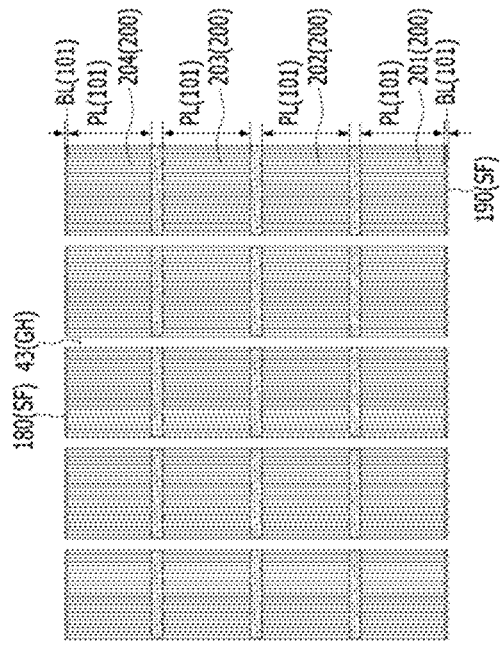

Alternatively, as illustrated in FIG. 12C, the second and the third unit anodic oxide film sheets 202 and 203 formed of the porous layers PL by removing the barrier layers thereof BL may be sequentially stacked on the top surface of the first unit anodic oxide film sheet 201.

As illustrated in FIGS. 12A to 12C, the upper guide plate 40 may be formed in a various shapes such that the structures of the first and the fourth unit anodic oxide film sheets 201 and 204 forming the surfaces SF including the upper and the lower surfaces 180 and 190 are the same, and by varying the shape of the second and the third unit anodic oxide film sheets 202 and 203 that are provided between the first and the fourth unit anodic oxide film sheets 201 and 204.

The structures in which the plurality of unit anodic oxide film sheets 200 are stacked illustrated FIGS. 10A to 12C are as examples and not limited thereto. If the structure of the upper guide plate 40 is configured such that the upper and the lower surfaces 180 and 190 are formed of the barrier layers BL and also the surfaces SF having the barrier layers BL are symmetrical to each other, there is no limitation on the structure in which the plurality of unit anodic oxide film sheets 200 are stacked.

Figure 13:
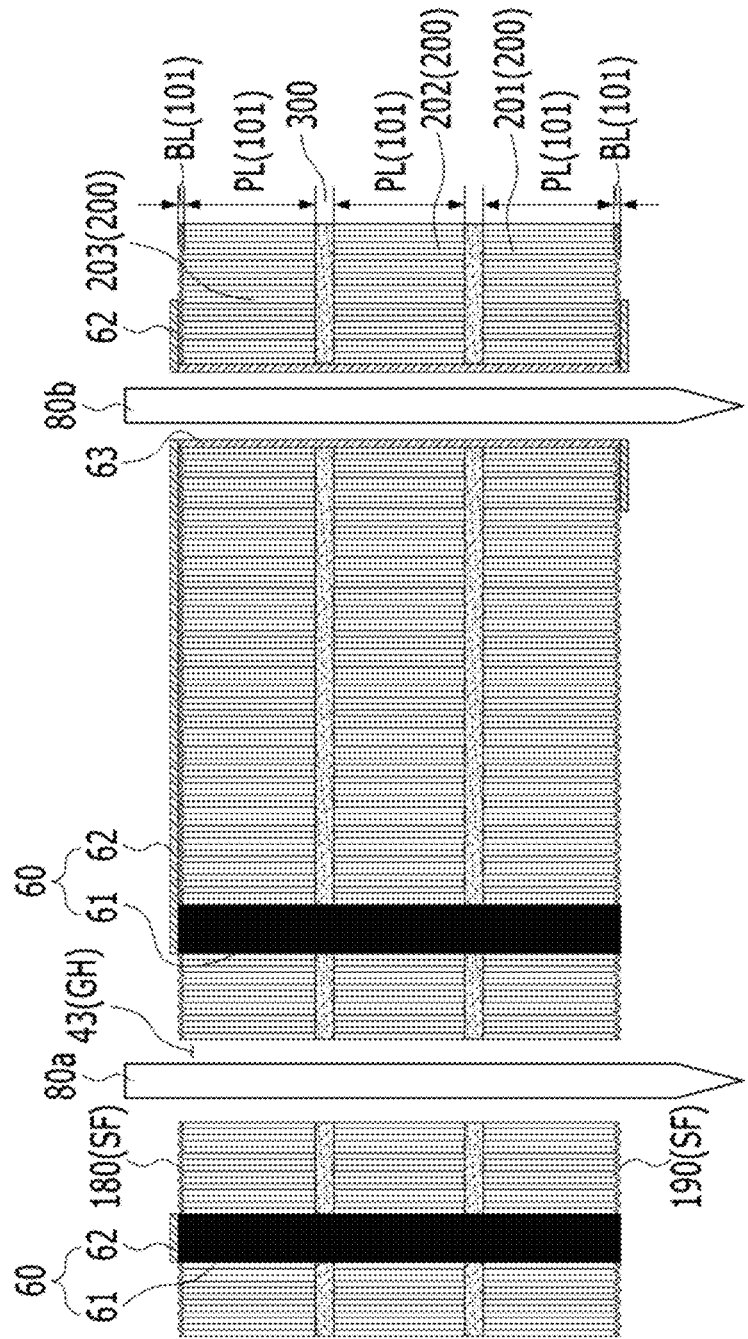
FIG. 13 is a view illustrating a state in which the probes and the shield portion are configured at the plurality of unit anodic oxide film sheets having a stacked structure.

FIG. 13 is a view illustrating a state in which the probe 80 and the shield portion 60 configured at the plurality of anodic oxide film sheets 200 having a stacked structure.

As illustrated in FIG. 13, the stacked anodic oxide film sheets 200 may include the shield portion 60. The shield portion 60 may be formed of the vertical formation portion 61 and the horizontal formation portion 62.

The vertical formation portion 61 may be formed by etching the stacked anodic oxide film sheets 200 perpendicular to the surface of the earth and then filling the etching hole H with the metal material. The vertical formation portion 61 may be formed in the longitudinal direction that is the same direction as the formation direction of the guide hole GH.

The horizontal formation portion 62 may be formed in the transverse direction that is perpendicular to the direction of formation of the guide hole GH. The horizontal formation portion 62 may be formed at at least one of the upper and the lower surfaces 180 and 190, and may be formed in contact with the vertical formation portion 61.

The horizontal formation portion 62 may be formed by extending to the guide hole at which the ground probe 80B is provided. The horizontal formation portion 62 may be formed by extending from the upper portion of the vertical formation portion 61 to the adjacent guide hole GH along the upper surface 180 of the unit anodic oxide film sheet 200. The horizontal formation portion 62 may be formed on the top surface of the third unit anodic oxide film sheet 203.

The inside of the guide hole GH connected through the horizontal formation portion 62 has the inner wall extension portion 63, so that the vertical formation portion 61, the horizontal formation portion 62, and the inner wall extension portion 63 may be electrically connected with each other.

Figure 14:
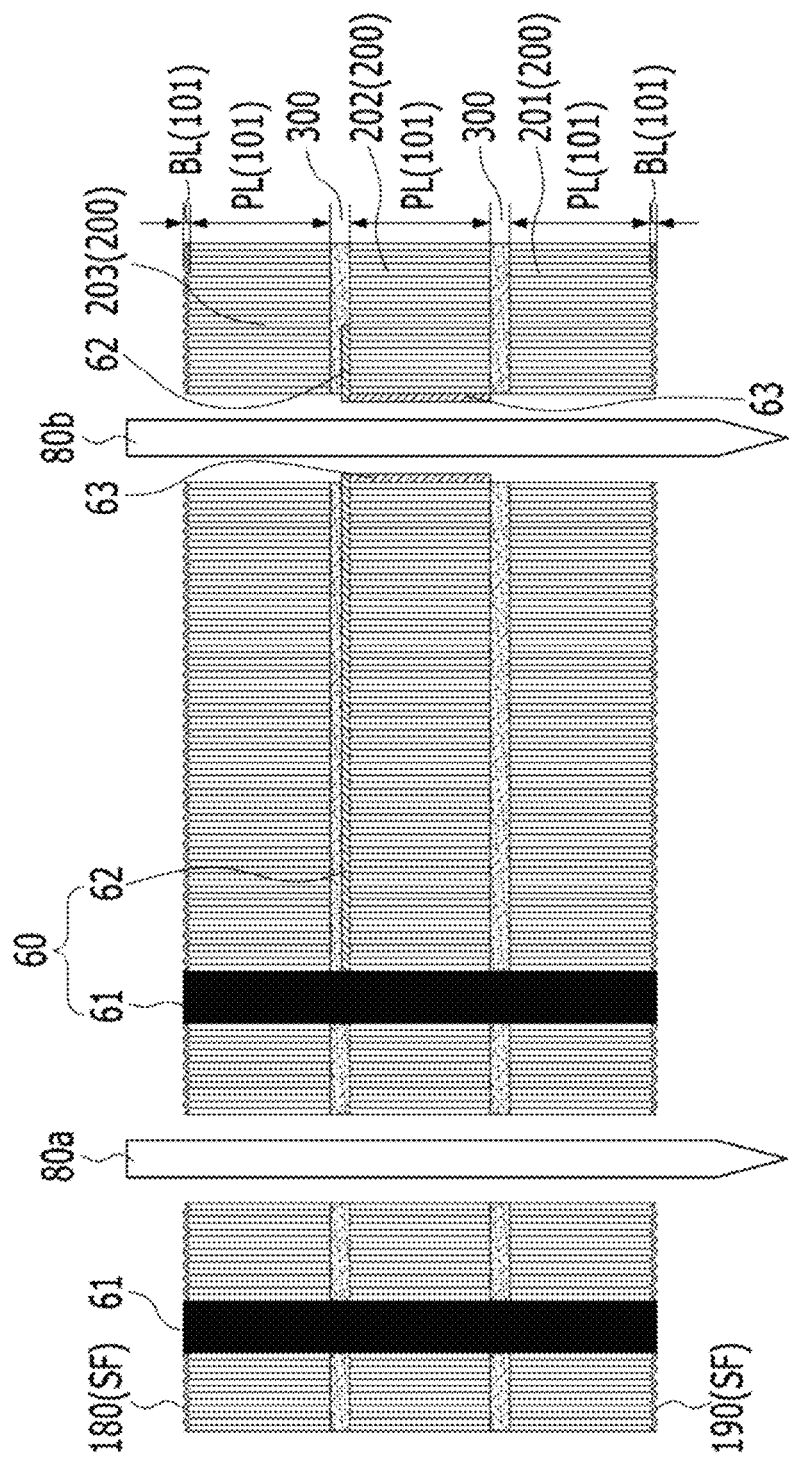
FIG. 14 is a view illustrating a state in which the horizontal formation portion is formed at a second unit anodic oxide film sheet among the plurality of unit anodic oxide film sheets having a stacked structure.

FIG. 14 is a view illustrating a state in which the horizontal formation portion 62 is formed at the second unit anodic oxide film sheet 202 among the plurality of unit anodic oxide film sheets 200 having a stacked structure.

As illustrated in FIG. 14, the horizontal formation portion 62 may be formed by being interposed between the plurality of unit anodic oxide film sheets 200. The horizontal formation portion 62 may be provided at the sheet bonding layer 300 that is formed when the plurality of unit anodic oxide film sheets 200 are stacked.

The inner wall extension portion 63 may be included at the inner wall surface of the guide hole GH of the unit anodic oxide film sheet 200 at which the horizontal formation portion 62 is formed. The inner wall extension portion 63 may be formed at the inner wall surface of the guide hole GH formed at the unit anodic oxide film sheet 200.

The horizontal formation portion 62 may be provided between the second unit anodic oxide film sheet 202 and the third unit anodic oxide film sheet 203. The horizontal formation portion 62 may be formed on the upper surface of the second unit anodic oxide film sheet 202.

The horizontal formation portion 62 may be formed at at least one of the upper or the lower surfaces of the second unit anodic oxide film sheet 202 before the first to the third unit anodic oxide film sheets 201, 202, and 203 are stacked. After the horizontal formation portion 62 is formed at at least one of the upper or the lower surfaces of the second unit anodic film sheet 202 and the sheet bonding layer 300 is formed, the first and the third unit anodic oxide film sheets 201 and 203 are stacked with the second unit anodic oxide film sheet 202.

The horizontal formation portion 62 may be formed in contact with the side surface of the vertical formation portion 61. The horizontal formation portion 62 may be formed by extending from the side surface of the vertical formation portion 61 to the guide hole GH at which the ground probe 80B is provided.

The inner wall extension portion 63 may be formed at the inner wall surface of the guide hole GH at which the ground probe 80B is provided. The inner wall extension portion 63 may only be formed at a portion of the inner wall surface of the guide hole GH. The inner wall extension portion 63 may be formed by being in contact with the horizontal formation portion 62 at the upper surface of the inner wall extension portion 63.

Figure 15:
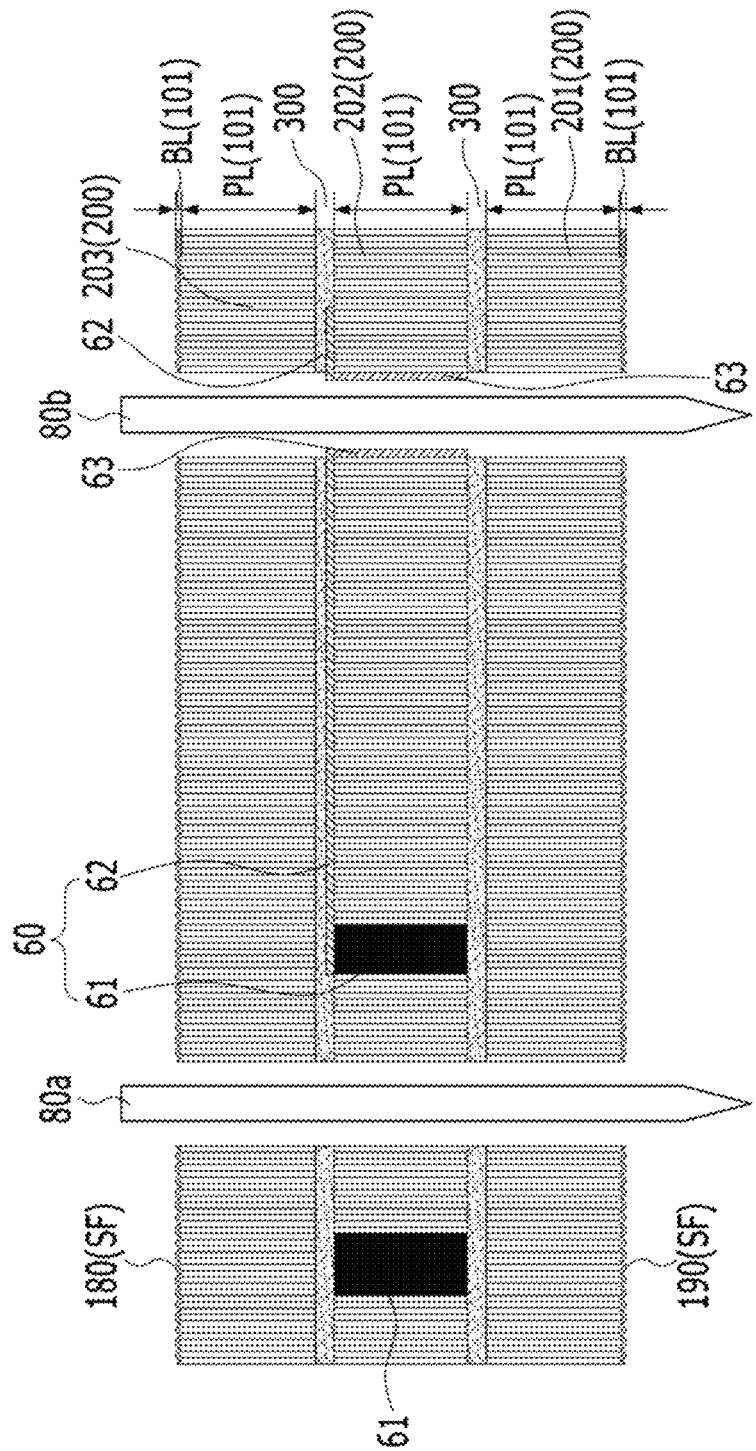
FIG. 15 is a view illustrating a state in which the shield portion is formed at the second unit anodic oxide film sheet among the plurality of unit anodic oxide film sheets having a stacked structure.

FIG. 15 is a view illustrating a state in which the shield portion 60 is formed at the second unit anodic oxide film sheet 202 among the plurality of unit anodic oxide film sheets 200 having a stacked structure.

As illustrated in FIG. 15, the shield portion 60 may be provided at at least one unit anodic oxide film sheet 200 among the plurality of unit anodic oxide film sheet 200 having a stacked structure.

The shield portion 60 may be provided at the second unit anodic oxide film sheet 202.

The shield portion 60 may be provided at the second unit anodic oxide film sheet 202 before the first to the third unit anodic oxide film sheets 201, 202, and 203 are stacked.

The vertical formation portion 61 may be formed by filling the etching hole H of the second unit anodic oxide film sheet 202 with a metal material. The vertical formation portion 61 may be formed between the first unit anodic oxide film sheet 201 and the third unit anodic oxide film sheet 203.

The horizontal formation portion 62 may be formed at at least one surface of the upper and the lower surfaces of the second unit anodic oxide film sheet 202. The horizontal formation portion 62 may be in contact with the upper surface of the vertical formation portion 61, and may be formed by extending to the guide hole GH at which the ground probe 80B is provided.

The inner wall extension portion 63 may be formed at the side surface of the second unit anodic oxide film sheet 202 from the inner wall surface of the guide hole GH at which the ground probe 80B is provided. The inner wall extension portion 63 may only be formed at a portion of the inner wall surface of the guide hole GH. The inner wall extension portion 63 may be formed by being in contact with the horizontal formation portion 62 at the upper surface of the inner wall extension portion 63.

The vertical formation portion 61, the horizontal formation portion 62, and the inner wall extension portion 63 may be electrically connected with each other by being in contact with each other.

According to an exemplary embodiment of the present disclosure, the shield portion 60 is formed at the periphery of the guide hole GH, and is grounded, so that signal interference that may occur between the probe 80 positioned inside the shield portion 60 and adjacent probes 80 may be prevented.

As such, in the probe head 1 according to an exemplary embodiment of the present disclosure, the guide plate GP is formed of the anodic oxide film 101 material, and the shield portion 60 is formed at the periphery of the guide hole GH into which the signal probe 80A is inserted, so that the signal interference that may occur between the adjacent probes 80 may be blocked.

Specifically, the shield portion 60 may be formed in a shape that completely blocks the inclination of the guide hole GH at the periphery of the guide hole GH. In this state, the shield portion 60 may be grounded by itself, or the shield portion 60 may be electrically connected to the guide hole GH after inserting the ground probe 80B into the adjacent guide hole GH, so that an electrical potential is maintained to be zero. Thus, the probe 80 provided inside the shield portion 60 may block the signal interference that occurred between the adjacent probes 80 by having the shield portion 60.

Although the exemplary embodiments of the present disclosure have been described for illustrative purposes, those skilled in the art will appreciate that various modifications, additions and substitutions are possible, without departing from the scope and spirit of the invention as disclosed in the accompanying claims.

What is claimed is:

1. A probe head, comprising:
a guide plate on which a first guide hole is provided,
wherein a signal probe is inserted into the first guide hole,
wherein the guide plate includes a shield portion formed at a periphery of the first guide hole,
wherein the shield portion includes vertical formation portions formed in a longitudinal direction of the first guide hole and a horizontal formation portion formed in contact with the vertical formation portions,
wherein the vertical formation portions are separated from the first guide hole so that the shield portion is electrically insulated from the signal probe,
wherein the guide plate is formed of an anodic oxide film,
wherein the vertical formation portions are formed by filling pores of the anodic oxide film,
wherein the horizontal formation portion is configured to integrally contact the vertical formation portions, and
wherein the first guide hole is formed by etching the guide plate, and the pores are formed during forming the anodic oxide film.

2. The probe head of claim 1, wherein the horizontal formation portion is formed in a transverse direction of the guide hole.

3. The probe head of claim 1, wherein the shield portion is grounded.

4. The probe head of claim 1, wherein the shield portion is electrically connected to a ground probe inserted in a second guide hole.

5. The probe head of claim 1, wherein the guide plate is formed by stacking a plurality of unit anodic oxide film sheets.

6. The probe head of claim 1, wherein the horizontal formation portion is extended to a second guide hole, and is formed on at least one of a top and a bottom surface of the anodic oxide film.

7. A probe card, comprising:
a space transformer including a vertical wiring portion, a horizontal wiring portion connected to the vertical wiring portion, and a plurality of connection pads;

a circuit board provided at an upper side of the space transformer; and a probe head provided at a lower side of the space transformer and including a plurality of probes, wherein the probe head comprises:
  a guide plate on which a guide hole is provided,
  wherein a signal probe is inserted into the guide hole,
  wherein the guide plate includes a shield portion formed at a periphery of the guide hole,
  wherein the shield portion includes vertical formation portions formed in a longitudinal direction of the guide hole and a horizontal formation portion formed in contact with the vertical formation portions,
  wherein the vertical formation portions are separated from the guide hole so that the shield portion is electrically insulated from the signal probe,
  wherein the guide plate is formed of an anodic oxide film,
  wherein the vertical formation portions are formed by filling pores of the anodic oxide film,
  wherein the horizontal formation portion is configured to integrally connect the vertical formation portions, and
  wherein the guide hole is formed by etching the guide plate, and the pores are formed during forming the anodic oxide film.

* * * * *